US012650645B2

(12) United States Patent
Chen

(10) Patent No.: US 12,650,645 B2
(45) Date of Patent: Jun. 9, 2026

(54) PHOTORESIST COMPOSITION AND METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventor: Chien-Chih Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/232,237

(22) Filed: Aug. 9, 2023

(65) Prior Publication Data

US 2023/0408918 A1     Dec. 21, 2023

Related U.S. Application Data

(62) Division of application No. 17/231,413, filed on Apr. 15, 2021.

(Continued)

(51) Int. Cl.
*G03F 7/038* (2006.01)
*C08L 101/02* (2006.01)
(Continued)

(52) U.S. Cl.
CPC .......... *G03F 7/0382* (2013.01); *C08L 101/02* (2013.01); *G03F 7/0045* (2013.01); *G03F 7/38* (2013.01); *G03F 7/40* (2013.01)

(58) Field of Classification Search
CPC ........ G03F 7/0382; G03F 7/0045; G03F 7/38; G03F 7/40; G03F 7/0042; G03F 7/004;
(Continued)

(56) References Cited

U.S. PATENT DOCUMENTS

| 8,796,666 B1 | 8/2014 | Huang et al. |
| 9,093,530 B2 | 7/2015 | Huang et al. |

(Continued)

FOREIGN PATENT DOCUMENTS

| WO | 2010043946 A2 | 4/2010 |
| WO | 2019/217749 A1 | 11/2019 |

OTHER PUBLICATIONS

T. Corrales,F. Catalina,C. Peinado,N.S. Allen, "Free radical macrophotoinitiators: an overview on recent advances", Journal of Photochemistry and Photobiology A: Chemistry 159 (2003) 103-114 (Year: 2003).

(Continued)

*Primary Examiner* — Jonathan Johnson
*Assistant Examiner* — Alexander N. Lee
(74) *Attorney, Agent, or Firm* — STUDEBAKER BRACKETT PLLC

(57) ABSTRACT

A method of manufacturing a semiconductor device includes forming a photoresist layer over a substrate. The photoresist layer includes a photoresist composition including a polymer. The polymer includes a monomer unit having a pendant sensitizer and crosslinking group, and a monomer unit having a pendant acid labile group. The photoresist layer is selectively exposed to actinic radiation, and the selectively exposed photoresist layer is developed.

20 Claims, 24 Drawing Sheets

Related U.S. Application Data

(60) Provisional application No. 63/038,739, filed on Jun. 12, 2020.

(51) Int. Cl.
*G03F 7/004* (2006.01)
*G03F 7/38* (2006.01)
*G03F 7/40* (2006.01)

(58) Field of Classification Search
CPC . C08L 101/02; C09D 201/02; H01L 21/0274; H10P 76/2041
See application file for complete search history.

(56) References Cited

U.S. PATENT DOCUMENTS

| | | | |
|---|---|---|---|
| 9,213,234 | B2 | 12/2015 | Chang |
| 9,223,220 | B2 | 12/2015 | Chang |
| 9,256,133 | B2 | 2/2016 | Chang |
| 9,310,684 | B2 | 4/2016 | Meyers et al. |
| 9,536,759 | B2 | 1/2017 | Yang et al. |
| 9,548,303 | B2 | 1/2017 | Lee et al. |
| 9,857,684 | B2 | 1/2018 | Lin et al. |
| 9,859,206 | B2 | 1/2018 | Yu et al. |
| 9,875,892 | B2 | 1/2018 | Chang et al. |
| 2006/0049387 | A1 | 3/2006 | Huang |
| 2007/0015082 | A1* | 1/2007 | Angelopoulos ....... G03F 7/0757 430/311 |
| 2007/0287098 | A1 | 12/2007 | Inno et al. |
| 2008/0045011 | A1 | 2/2008 | Fuller et al. |
| 2012/0088369 | A1 | 4/2012 | Weidman et al. |
| 2014/0004712 | A1 | 1/2014 | Chen et al. |
| 2015/0004801 | A1 | 1/2015 | Rahman et al. |
| 2016/0005595 | A1* | 1/2016 | Liu .......................... G03F 7/405 438/763 |
| 2016/0116839 | A1* | 4/2016 | Meyers ................. G03F 7/2004 430/326 |
| 2016/0238933 | A1 | 8/2016 | Su et al. |
| 2017/0271150 | A1* | 9/2017 | Chang ....................... G03F 7/11 |
| 2018/0364570 | A1* | 12/2018 | Hatakeyama ............. G03F 7/38 |

OTHER PUBLICATIONS

Non-Final Office Action issued in U.S. Appl. No. 17/231,413, dated Jan. 19, 2023.
Final Office Action issued in U.S. Appl. No. 17/231,413, dated Jul. 21, 2023.

\* cited by examiner

PHOTORESIST COMPOSITION AND METHOD OF MANUFACTURING A SEMICONDUCTOR DEVICE

RELATED APPLICATIONS

This application is a divisional application of U.S. application Ser. No. 17/231,413, filed Apr. 15, 2021, which claims priority to U.S. Provisional Patent Application No. 63/038,739, filed Jun. 12, 2020, the entire contents of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-verse.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7B and 7C show reactions an organic photoresist composition according to embodiments of the disclosure undergo when exposed to radiation.

FIG. 9 shows an example of a reaction that a photoresist composition according to an embodiment of the disclosure undergoes when exposed to radiation.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Negative tone photoresists may suffer from film loss resulting from acid labile group outgassing and dissolution in the developer. The acid labile group outgassing may also induce stress in the photoresist film. In addition, during the post exposure baking, the photoresist film may shrink. Photoresist shrinking and film loss negatively impact the pattern contrast and the size and consistency of features subsequently formed in an underlying substrate or layer to be patterned (target layer), resulting in reduced device yield. Embodiments of the present disclosure address these issues, and reduce the amount of film loss during development and reduce photoresist shrinkage. Embodiments of the present disclosure provide improved photoresist pattern contrast and allow reduced exposure dose and increase the manufacturing yield of semiconductor devices.

Figure 1:
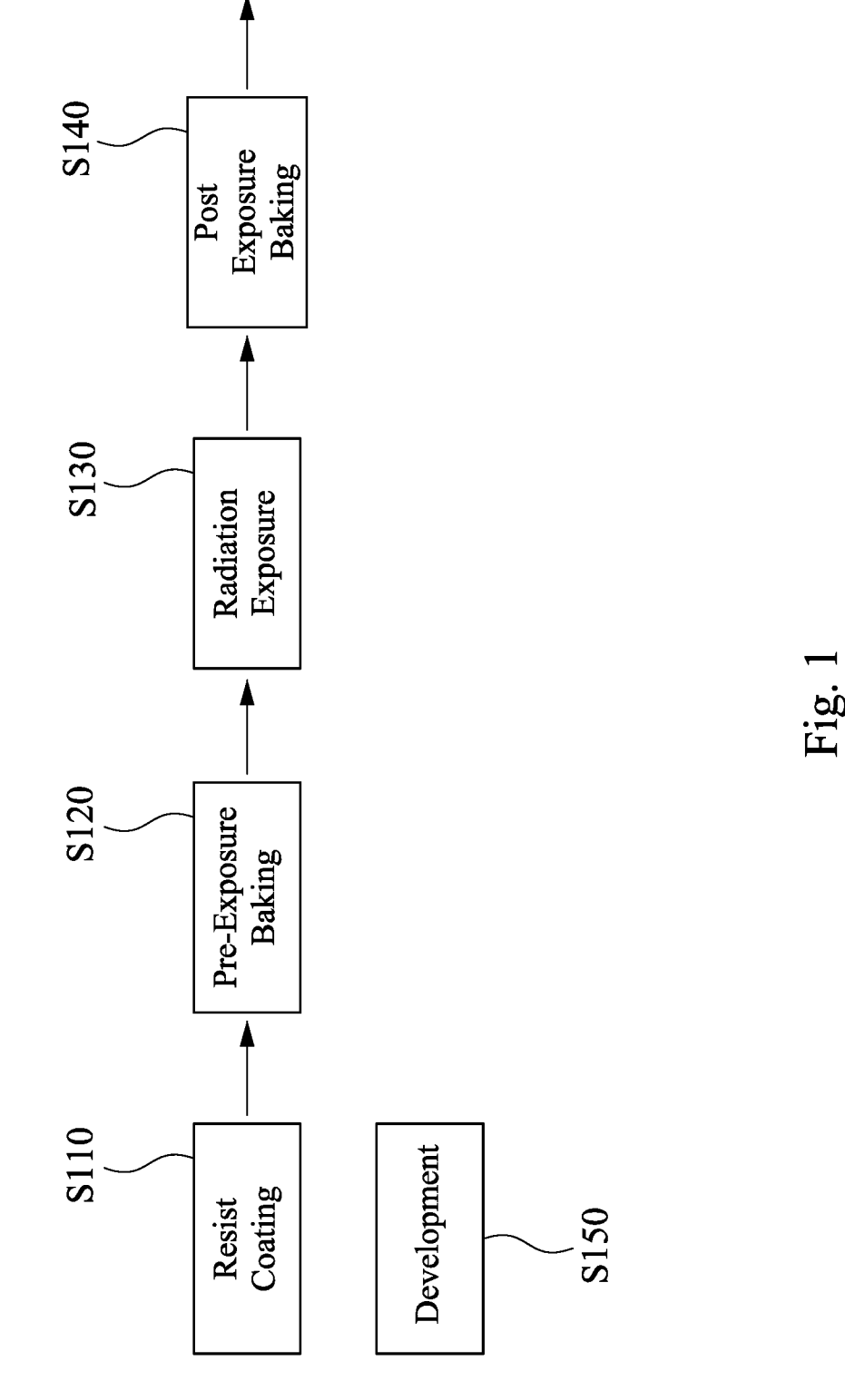
FIG. 1 illustrates a process flow of manufacturing a semiconductor device according to embodiments of the disclosure.
Figure 2:
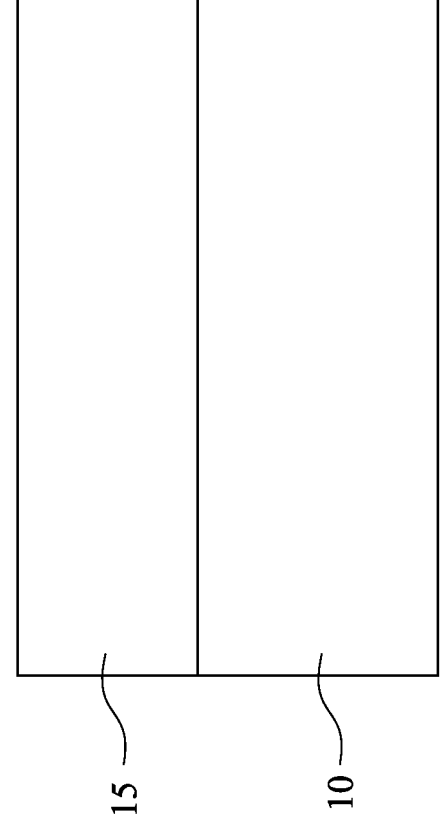
FIG. 2 shows a process stage of a sequential operation according to an embodiment of the disclosure.

FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. In some embodiments, the resist is a photoresist. In some embodiments, the photoresist is an organic, chemically amplified resist (CAR) formed by a spin-coating method. In some embodiments, the resist is a metal-containing photoresist formed by chemical vapor deposition (CVD) or atomic layer deposition (ALD). In some embodiments, the metal-containing photoresist layer is formed by a spin-coating method.

Then the resist layer 15 undergoes a first baking (or pre-exposure baking) operation S120 to evaporate solvents in the resist composition in some embodiments. The resist layer 15 is baked at a temperature and time sufficient to cure and dry the resist layer 15. In some embodiments, the resist layer 15 is heated at a temperature of about 40° C. and 150° C. for about 10 seconds to about 10 minutes.

The resist layer 15 is selectively exposed (or patternwise exposed) to actinic radiation 45 (see FIGS. 3A and 3B) in operation S130. In some embodiments, the resist layer 15 is selectively exposed to ultraviolet radiation. In some embodiments, the ultraviolet radiation is deep ultraviolet radiation. In some embodiments, the ultraviolet radiation is extreme ultraviolet (EUV) radiation. In some embodiments, the radiation is an electron beam.

Figure 3A:
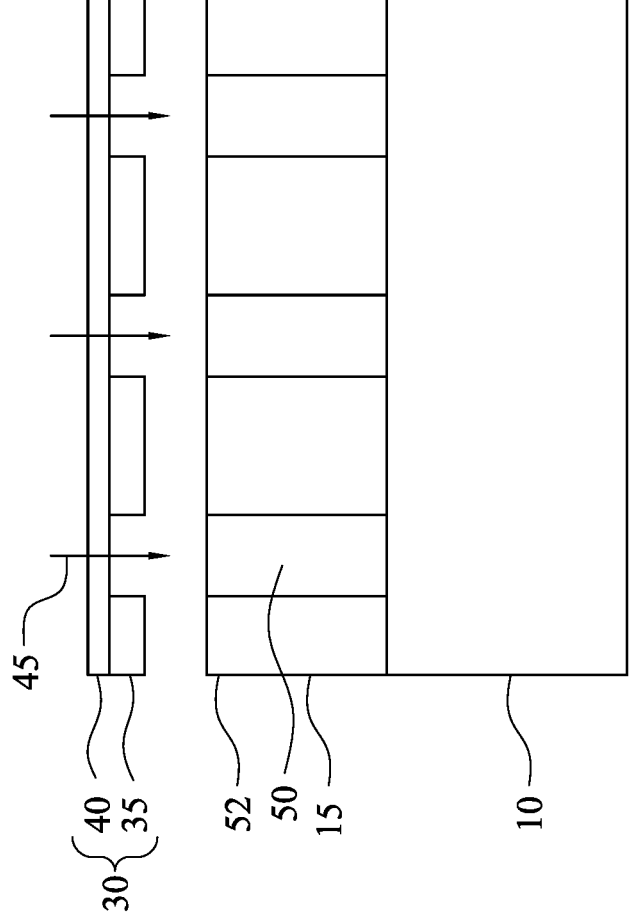
FIGS. 3A and 3B show a process stage of a sequential operation according to embodiments of the disclosure.

As shown in FIG. 3A, the exposure radiation 45 passes through a photomask 30 before irradiating the resist layer 15 in some embodiments. In some embodiments, the photomask has a pattern to be replicated in the resist layer 15. The pattern is formed by an opaque pattern 35 on photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
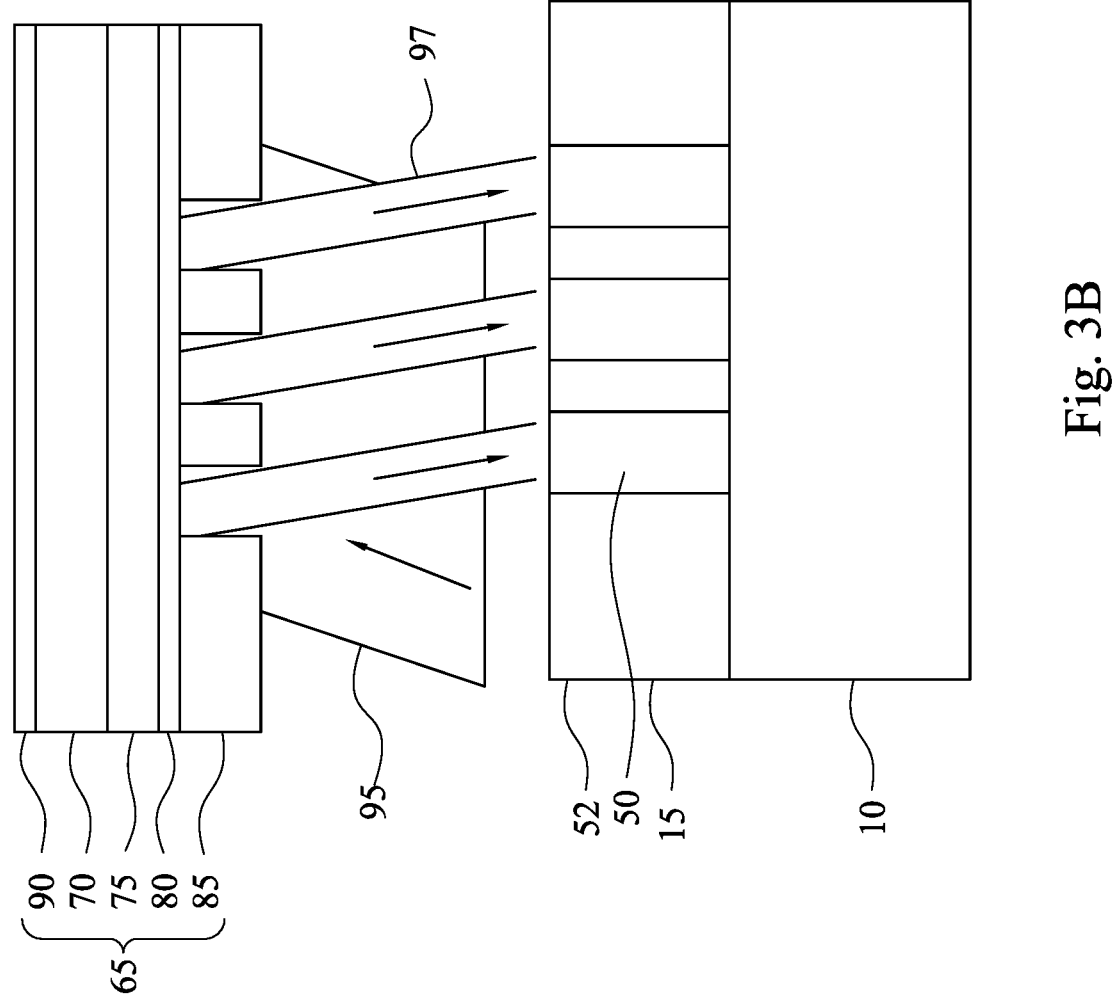

In some embodiments, the selective exposure of the photoresist layer 15 to form exposed regions 50 and unexposed regions 52 is performed using extreme ultraviolet lithography. In an extreme ultraviolet lithography operation, a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

In some embodiments, the resist layer 15 is a photoresist layer. The region of the photoresist layer 15 exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction.

The amount of electromagnetic radiation the photoresist layer 15 is exposed to can be characterized by a fluence or dose, which is obtained by the integrated radiative flux over the exposure time. Suitable radiation fluences range from about 1 mJ/cm$^2$ to about 150 mJ/cm$^2$ in some embodiments, from about 2 mJ/cm$^2$ to about 100 mJ/cm$^2$ in other embodiments, and from about 3 mJ/cm$^2$ to about 50 mJ/cm$^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 μC/cm$^2$ to about 5 μC/cm$^2$ in some embodiments, from about 0.5 μC/cm$^2$ to about 1 μC/cm$^2$ in other embodiments, and in other embodiments from about 1 μC/cm$^2$ to about 100 μC/cm$^2$. A person of ordinary skill in the art can compute corresponding doses at other beam energies based on the teachings herein and will recognize that additional ranges of electron beam properties within the explicit ranges above are contemplated and are within the present disclosure.

Next, the resist layer 15 undergoes a heating or a post-exposure bake (PEB) in operation S140. In some embodiments, the resist layer 15 is heated at a temperature of about 50° C. to about 250° C. for about 20 seconds to about 300 seconds. In some embodiments, the post-exposure baking is performed at a temperature ranging from about 100° C. to about 230° C., and at a temperature ranging from about 150° C. to about 200° C. in other embodiments. In some embodiments, the post-exposure baking operation S140 causes the reaction product of a first compound or first precursor and a second compound or second precursor in the resist layer 15 that was exposed to actinic operation in operation S130 to further crosslink.

Figure 4:
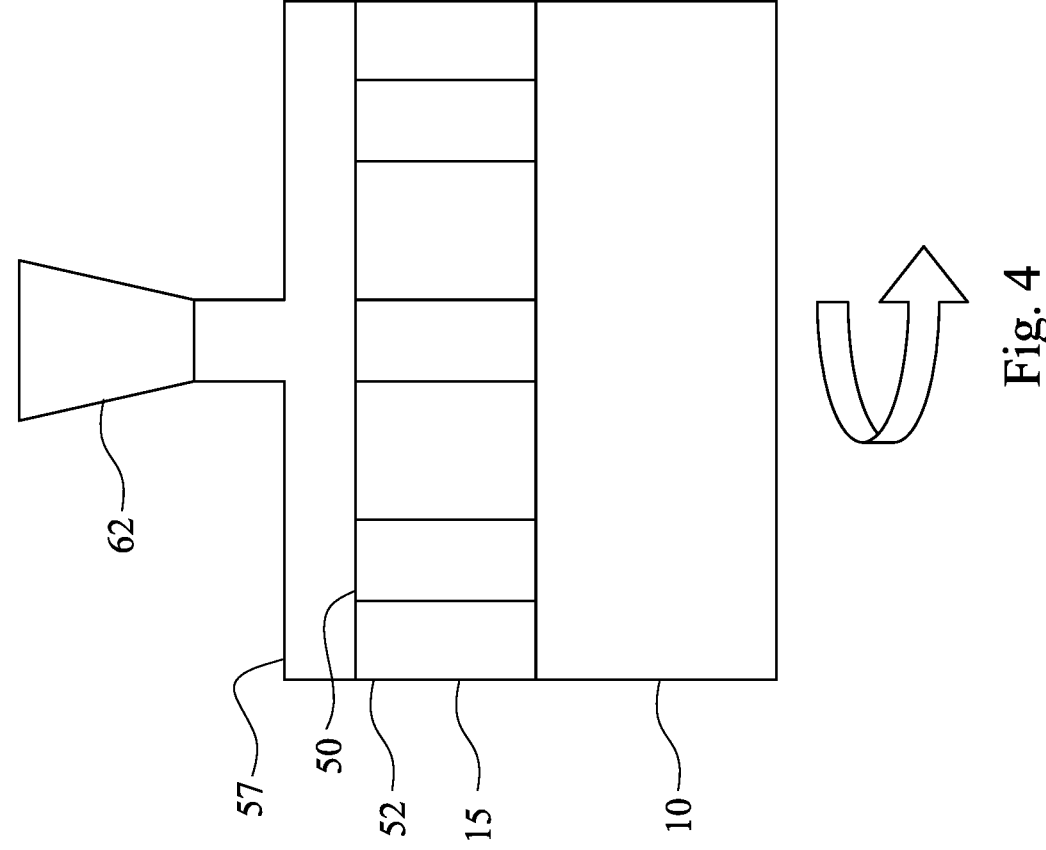
FIG. 4 shows a process stage of a sequential operation according to an embodiment of the disclosure.
Figure 5:
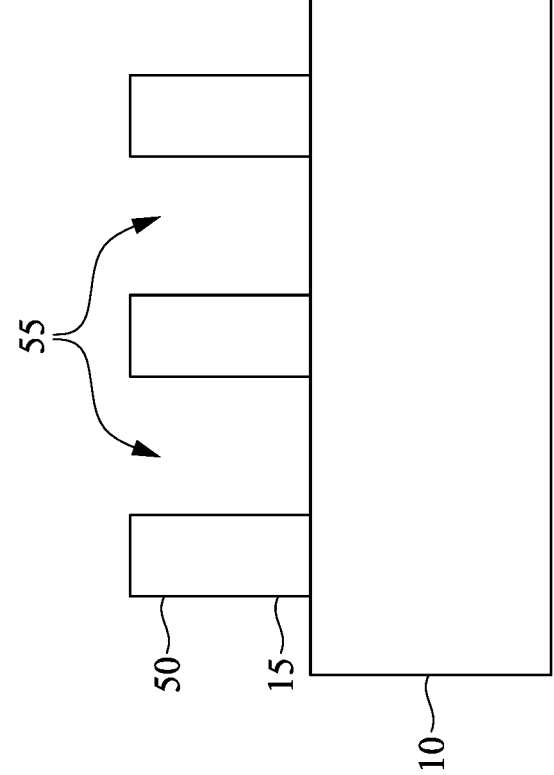
FIG. 5 shows a process stage of a sequential operation according to an embodiment of the disclosure.

The selectively exposed resist layer is subsequently developed by applying a developer to the selectively exposed resist layer in operation S150. As shown in FIG. 4, a developer 57 is supplied from a dispenser 62 to the resist layer 15. In some embodiments, the unexposed portion of the resist layer 52 is removed by the developer 57 forming a pattern of openings 55 in the resist layer 15 to expose the substrate 10, as shown in FIG. 5.

Figure 6:
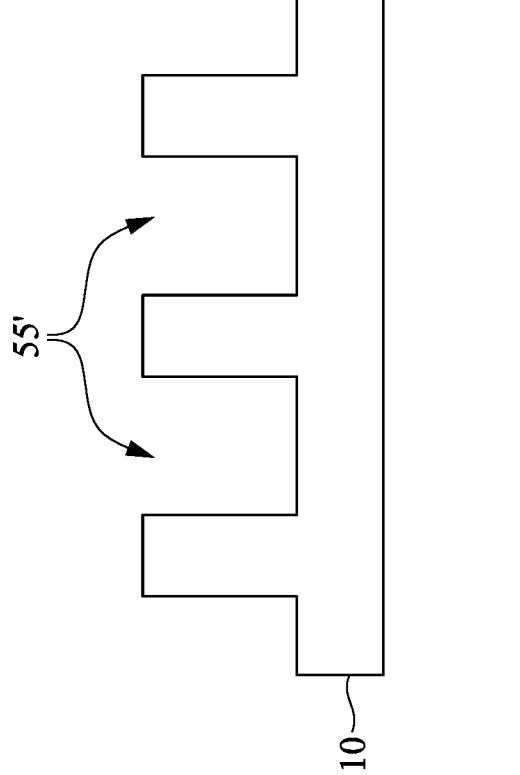
FIG. 6 shows a process stage of a sequential operation according to an embodiment of the disclosure.

In some embodiments, the pattern of openings 55 in the resist layer 15 are extended into the layer to be patterned or substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. The exposed resist layer 15 is at least partially removed during the etching operation in some embodiments. In other embodiments, the exposed resist layer 15 is removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least silicon, metal oxide, and metal nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresists can be positive tone resists or negative tone resists. A positive tone resist refers to a photoresist material that when exposed to radiation (e.g.—UV light) becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation. In some embodiments, the resist is a negative tone developed (NTD)

resist. In an NTD resist, a developer solvent is selected that preferentially dissolves the unexposed portion of the resist to form the patterned resist.

In some embodiments, an organic material is used as a photoresist for a NTD process. In some embodiments, the photoresist composition includes photo-crosslinkable functional groups and a sensitizer. During actinic radiation exposure, a sensitizer absorbs the actinic radiation and generates an electron and a radical cation. The radical cation becomes a neutral radical when a proton is spontaneously released from the sensitizer. The released proton can deprotect acid labile groups (ALGs) after a thermal treatment. In some embodiments, if the polymer has some functional groups, which can further react with the radicals, not only polar switch groups but also crosslink frameworks form and give a much higher contrast and allow for a lower exposure dose. Novel photoradical-assisted self-polymerization photoresist compositions according to embodiments of the disclosure comprise organic polymers with sensitizers, photocrosslinkable groups, acid labile groups, additional organic groups, photoacid generators, quenchers, and additives, as shown in FIG. 7A.

Figure 7A:
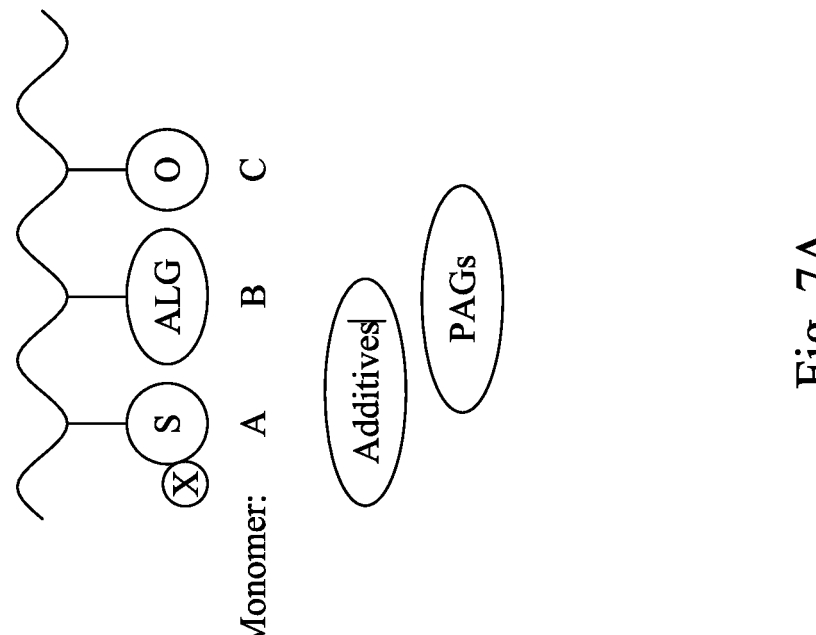
FIG. 7A shows an organic photoresist composition according to an embodiment of the disclosure.

A photoresist composition according to embodiments of the disclosure includes a polymer made up of two or more monomer units, wherein one monomer unit A has a pendant sensitizer group S and a crosslinking group X, wherein the crosslinking group X is bonded to the sensitizer group S, as shown in FIG. 7A. The sensitizer absorbs the actinic radiation and releases a secondary electron or forms a radical in response to the actinic radiation absorption in some embodiments. In some embodiments, the polymer further includes a monomer unit B having a pendant acid labile (ALG) group. In some embodiments, the polymer further includes a monomer unit C having a pendant organic group O. In some embodiments, the pendant organic group O assists the polymer in adhesion to an underlying layer, improves etching resistance of the photoresist, and assists in controlling patterning. In some embodiments, the photoresist composition includes a photoacid generator (PAG) and additives, such as a quencher or a surfactant.

In some embodiments, the sensitizer group S is a chromophore. In some embodiments, the sensitizer group S is one or more of a C3-C20 aliphatic or aromatic group having one or more photosensitive functional groups. In some embodiments, the one or more photosensitive functional groups are selected from the group consisting of a substituted or unsubstituted aromatic group and a substituted or unsubstituted heterocyclic group. In some embodiments, the aromatic group is one or more selected from the group consisting of a phenyl group, a naphthalenyl group, a phenanthrenyl group, an anthracenyl group, a phenalenyl group, and a three- to five-membered ring. In some embodiments, the aromatic group or heterocyclic group is substituted with one or more selected from the group consisting of a C1-C4 alkyl group, —F, —Cl, —Br, —I, —OH, —COOH, —COOR, —NO$_2$, —NH$_2$, —NHR, —NR$_2$, —CN, —SH, a carbonyl group, and a thionyl group, where R is a C1-C4 alkyl group.

In some embodiments, the crosslinking group X is a radical sensitive or a photosensitive group and the crosslinking bond can form by photoradical-assisted polymerization in the exposed area. In some embodiments, the crosslinking group is bonded to the sensitizer group. In some embodiments, the crosslinking group is one or more of a C2-C30 aliphatic or aromatic group having a functional group selected from the group consisting of an epoxy group, an azo group, an alkyl halide group, an imine group, an alkene group, an alkyne group, a peroxide group, a ketone group, an aldehyde group, an allene group, or a heterocyclic group. In some embodiments, the aromatic group or heterocyclic group is one or more selected from the group consisting of a phenyl group, a naphthalenyl group, a phenanthrenyl group, an anthracenyl group, a phenalenyl group, and a three- to ten-membered ring.

In some embodiments, the acid labile group ALG is a cyclic or non-cyclic, substituted or unsubstituted aliphatic or aromatic group, or a heterocyclic group. In some embodiments, the acid labile group ALG is one or more selected from the group consisting of an ester group, an amide group, an imine group, an acetal group, a ketal group, an anhydride group, a sulfonic ester group, a t-butyl group, a tert-butoxy-carbonyl group, an iso-norbornyl group, a 2-methyl-2-ada-mantyl group, a 2-ethyl-2-adamantyl group, a 3-tetrahydro-furan group, a lactone group, a 2-tetrahydrofuran group, and a 2-tetrahydropyran group. In some embodiments, the acid labile group is unsubstituted or substituted with one or more functional groups selected from the group consisting of —I, —Br, —Cl, —F, —NH$_2$, —COOH, —OH, —SH, —N$_3$, —S(=O)—, an alkene group, an alkyne group, an imine group, an ether group, a vinyl ether group, an acetal group, a hemiacetal group, an ester group, an aldehyde group, a ketone group, an amide group, a sulfone group, an acetic acid group, a cyanide group, and an allene group.

In some embodiments, the pendant organic group O, is an unsubstituted C1-C30 group or a C1-C30 group substituted with one or more of —I, —Br, —Cl, —F, —NH$_2$, —COOH, —OH, —SH, —N$_3$, —S(=O)—, an alkene group, an alkyne group, an imine group, an ether group, an ester group, an aldehyde group, a ketone group, an amide group, a sulfone group, an acetic acid group, a carboxylic acid group, or a cyanide group.

Figure 7B:
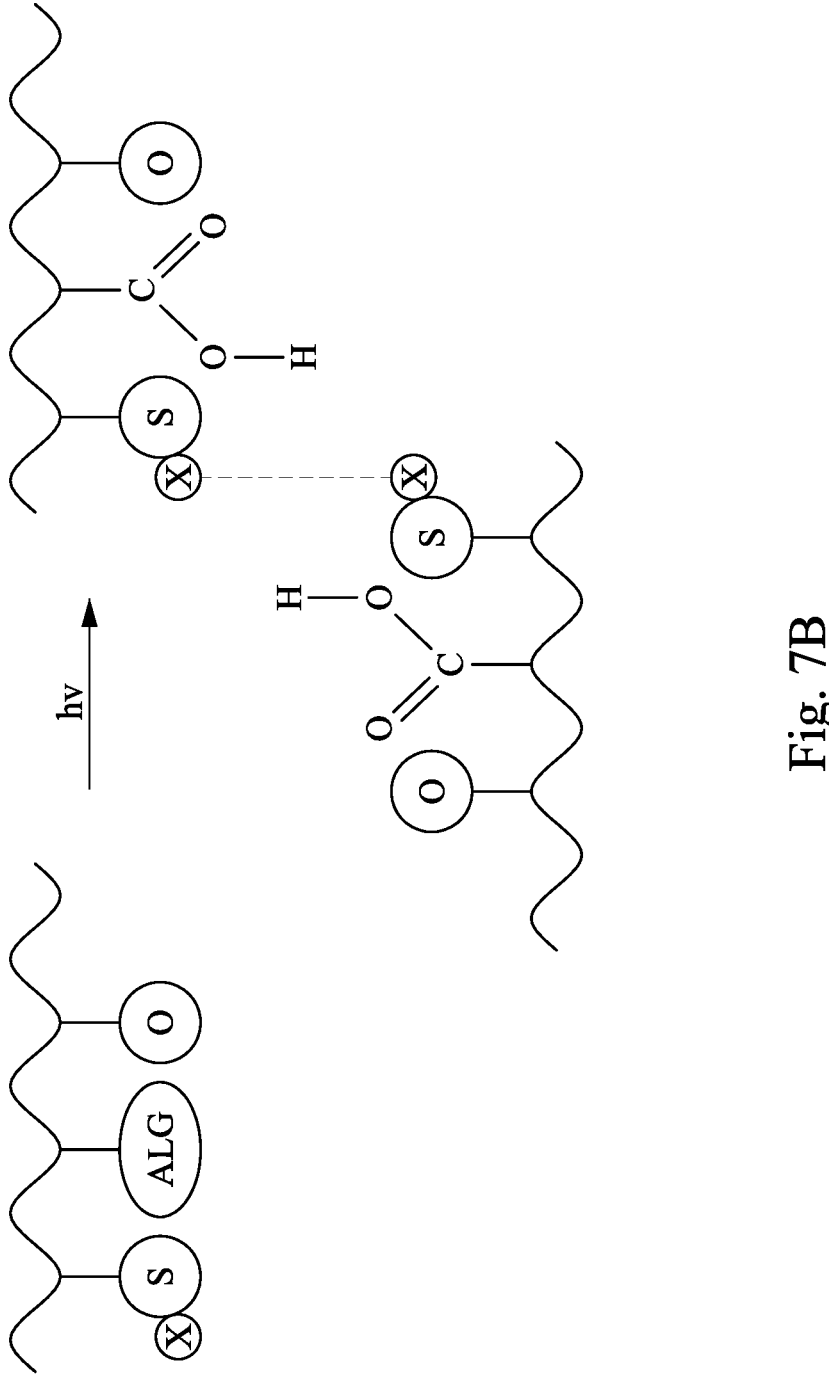

FIG. 7B shows a reaction that a polymer in a photoresist composition undergoes when exposed to radiation according to an embodiment of the disclosure. During the actinic radiation exposure (hv), the sensitizer group S absorbs the actinic radiation and generates a secondary electron and a radical cation. The radical cation becomes a neutral radical when a proton is spontaneously released from the sensitizer group. A resonance structure is created, making the cross-linking group more reactive. The radical activates the cross-linking groups X, causing adjacent crosslinking groups X to react with each other and crosslink. The released proton and protons generated by photoactive compounds, such as photoacid generators, in the photoresist composition react with and deprotect the acid labile groups (ALGs). In some embodiments, the action of the protons (e.g., H$^+$) generates carboxyl groups at the ALG sites. In other embodiments, additional crosslinking occurs at the deprotected ALG sites.

Figure 7C:
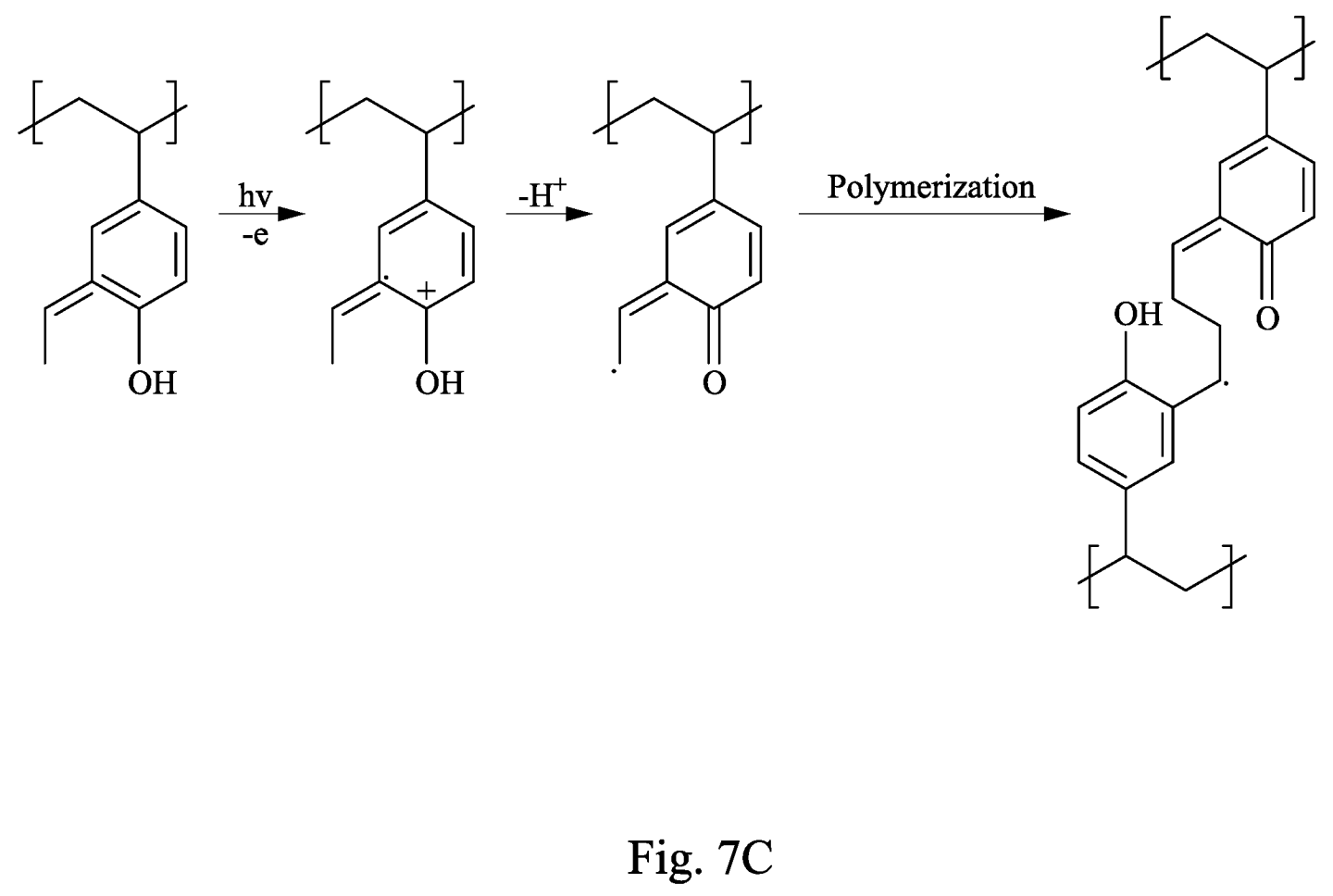

FIG. 7C shows an example of a reaction that a polymer in a photoresist composition undergoes when exposed to radiation. In this example, the polymer is a polyhydroxystyrene-based polymer with an alkene functional group attached to the aromatic sensitizer group. Upon exposure to actinic radiation hv, a secondary electron –e and a proton H$^+$ are released generating radical, and the adjacent radicals cross-link through the crosslinking groups.

The polymer is made of repeating monomer units A, B, and/or C shown in FIG. 7A. In some embodiments, the backbone of the polymer includes repeating units selected from the group consisting of acrylic esters, methacrylic esters, crotonic esters, vinyl esters, maleic diesters, fumaric diesters, itaconic diesters, (meth)acrylonitriles, (meth)acry-lamides, styrenes, hydroxystyrenes, vinyl ethers, and combinations thereof. In some embodiments, the polymer has a polymethylmethacrylate or polyhydroxystyrene backbone. In some embodiments, the backbone is a copolymer of polymethylmethacrylate and polyhydroxystyrene.

Specific structures that are utilized for repeating units of the resin structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl meth-acrylate, n-butyl methacrylate, isobutyl methacrylate, tert-butyl methacrylate, n-hexyl methacrylate, 2-ethylhexyl methacrylate, acetoxyethyl methacrylate, phenyl methacry-late, 2-hydroxyethyl methacrylate, 2-methoxyethyl meth-acrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-ac-etoxy-2-hydroxypropyl methacrylate, 3-chloroacetoxy-2-hydroxypropyl methacrylate, butyl crotonate, hexyl croto-nate, or the like. Examples of the vinyl esters include vinyl acetate, vinyl propionate, vinyl butylate, vinyl methoxyac-etate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phe-nyl acrylamide, benzyl acrylamide, methacrylamide, methyl methacrylamide, ethyl methacrylamide, propyl methacryl-amide, n-butyl methacrylamide, tert-butyl methacrylamide, cyclohexyl methacrylamide, 2-methoxyethyl methacrylam-ide, dimethyl methacrylamide, diethyl methacrylamide, phe-nyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dim-ethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinyl-carbazole, combinations of these, or the like.

In some embodiments, the polymer has a weight average molecular weight of about 1000 to about 200,000.

Some embodiments of the photoresist composition include one or more photoactive compounds (PACs). The PACs are photoactive components, such as photoinitiators, photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, oxime sulfonate, disulfone, o-nitrobenzylsulfonate, sulfonated esters, halogenated sulfonyloxy dicarboximides, diazodis-ulfones, α-cyanooxyamine-sulfonates, imidesulfonates, ketodiazosulfones, sulfonyldiazoesters, 1,2-di(arylsulfonyl) hydrazines, nitrobenzyl esters, and the s-triazine derivatives, combinations of these, or the like.

Specific examples of photoacid generators include α-(tri-fluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments the PACs include free-radical generator photoinitiators, including n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimer; combinations of these, or the like.

In some embodiments, the PAC includes photobase generators and photo decomposable bases. In embodiments in which the PACs are photobase generators (PBG), the PBGs include quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

In some embodiments in which the PACs include photo decomposable bases (PBD), the PBDs include triphenylsulfonium hydroxide, triphenylsulfonium antimony hexafluoride, and triphenylsulfonium trifyl.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

A quencher is added to some embodiments of the photoresist composition to inhibit diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof, including its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof, including its esters, such as phenylphosphinic acid.

In some embodiments, a surfactant is added to the photoresist composition. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations thereof, or the like.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and arylammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment, bile-salt esters may be used as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent, such as a carboxyl group, a methacryloyl group, an isocyanate group, or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

The photoresist composition includes a solvent in some embodiments. The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the resin and the PACs, along with any desired additives or other agents, are added to the solvent for application. Once added, the mixture is then mixed in order to achieve a homogenous composition throughout the photoresist composition to ensure that there are no defects caused by uneven mixing or nonhomogenous composition of the photoresist. Once mixed together, the photoresist may either be stored prior to its usage or used immediately.

Once ready, the photoresist composition is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

In some embodiments, the photoresist composition includes an organometallic material. In some embodiments, the photoresist composition is an NTD resist including a metal core and two different organic ligands. A first ligand is a photo-cleavable ligand and the second ligand is a non-photo-cleavable ligand having a crosslinking group.

During the exposure to actinic radiation, the metal core absorbs actinic radiation and generates a radical through metal core-ligand bond cleavage from the photo-cleavable ligand. In some embodiments, more secondary electrons are generated by photo excitation of the organometallic than a non-metallic organic compound because the binding energy of the electrons for the metal is lower. In addition, the metal core-ligand bond is also cleavable by secondary electron excitation. Radicals generated from the metal core-ligand bond cleavage initiate and trigger polymerization when the non-cleavable ligand on the metal has specific functional groups that can react with the radicals in some embodiments. Photoradical-assisted self-polymerization occurs, and not only metal oxides, but also organic crosslink frameworks form, providing much higher contrast and enabling a lower exposure dose to be used to pattern the photoresist layer.

Figure 8A:
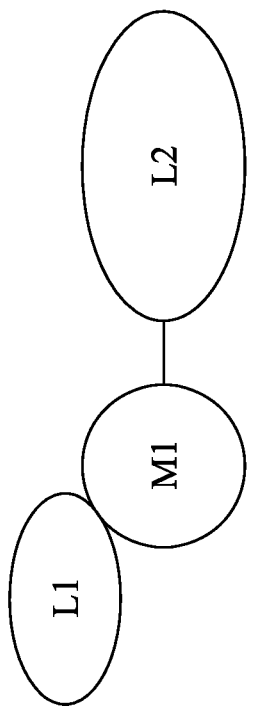
FIG. 8A shows an organometallic photoresist composition according to an embodiment of the disclosure.

Some embodiments of the photoresist composition include a photoresist composition comprising a monomer, wherein the monomer includes a metal and a crosslinking group. In some embodiments, the photoresist composition includes an organometallic material having a metal core M1, a first photo-cleavable ligand L1 and a second non-photo-cleavable ligand L2 having a crosslinking group, as shown in FIG. 8A.

In some embodiments, the metal core M1 includes one or more metal atoms. In some embodiments, the one or more metal atoms are selected from the group consisting of Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, Sb, and Bi.

In some embodiments, the first photo-cleavable ligand L1 is an aliphatic or aromatic, cyclic or non-cyclic C1-C30 group, wherein the C1-C30 group is unsubstituted or substituted with one or more selected from the group consisting of —I, —Br, —Cl, —F, —NH$_2$, —COOH, —OH, —SH, —N$_3$, —S($=$O)—, an alkene group, an alkyne group, an imine group, an ether group, an ester group, an aldehyde group, a ketone group, an amide group, a sulfone group, an acetic acid group, a cyanide group, an alkene group, an alcohol group, a diol group, an amine group, a phosphine group, a phosphite group, an aniline group, a pyridine group, and a pyrrole group. In some embodiments, the M1-L1 bond has sp3 characteristics and forms a stable radical. When a stable radical can be formed the M1-L1 bond is photocleavable. On the other hand, if the ligand L1 includes strong electron withdrawing groups, the ligand L1 may not form a stable radical. When a stable radical can not be formed the M1-L1 bond is not be photocleavable.

The second ligand L2 is different from the first ligand L1. In some embodiments, the second ligand L2 is an aliphatic or aromatic, cyclic or on-cyclic C2-C30 group, wherein the C2-C30 group is unsubstituted or substituted with one or more selected from the group consisting of —I, —Br, —Cl, —F, —NH$_2$, —COOH, —OH, —SH, —N$_3$, —S($=$O)—, an alkene group, an alkyne group, an imine group, an ether group, an ester group, an aldehyde group, a ketone group, an amide group, a sulfone group, an acetic acid group, a cyanide group, an allelic group, an alcohol group, a diol group, an amine group, a phosphine group, a phosphite group, an aniline group, a pyridine group, and a pyrrole group. In some embodiments, the M1-L2 bond has sp2 characteristics and does form a stable radical. When a stable radical can not formed the M1-L2 bond is not photocleavable.

In some embodiments, the photoresist composition includes a third ligand that is different from the first ligand and the second ligand. In some embodiments, the third ligand includes C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In other embodiments, the third ligand includes branched or unbranched, cyclic or non-cyclic, saturated organic groups, including C1-C7 alkyl groups or C1-C7 fluoroalkyl groups. In some embodiments, the C1-C7 alkyl groups or C1-C7 fluoroalkyl groups include one or more substituents selected from the group consisting of —CF$_3$, —SH, —OH, $=$O, —S—, —P—, —PO$_2$, —C($=$O)SH, —COOH, —C($=$O)O—, —O—, —N—, —C($=$O)NH, —SO$_2$OH, —SO$_2$SH, —SOH, and —SO$_2$—. In some embodiments, the ligand includes one or more substituents selected from the group consisting of —CF$_3$, —OH, —SH, and —COOH substituents.

In some embodiments, the metal-containing photoresist composition includes a solvent, a quencher, or a surfactant. The solvent, quencher, or surfactant may be any of the solvents, quenchers, or surfactants disclosed herein. In some embodiments the metal-containing photoresist composition includes a chromophore or counter ions.

Figures 8B, 8C, 8D, 8E:
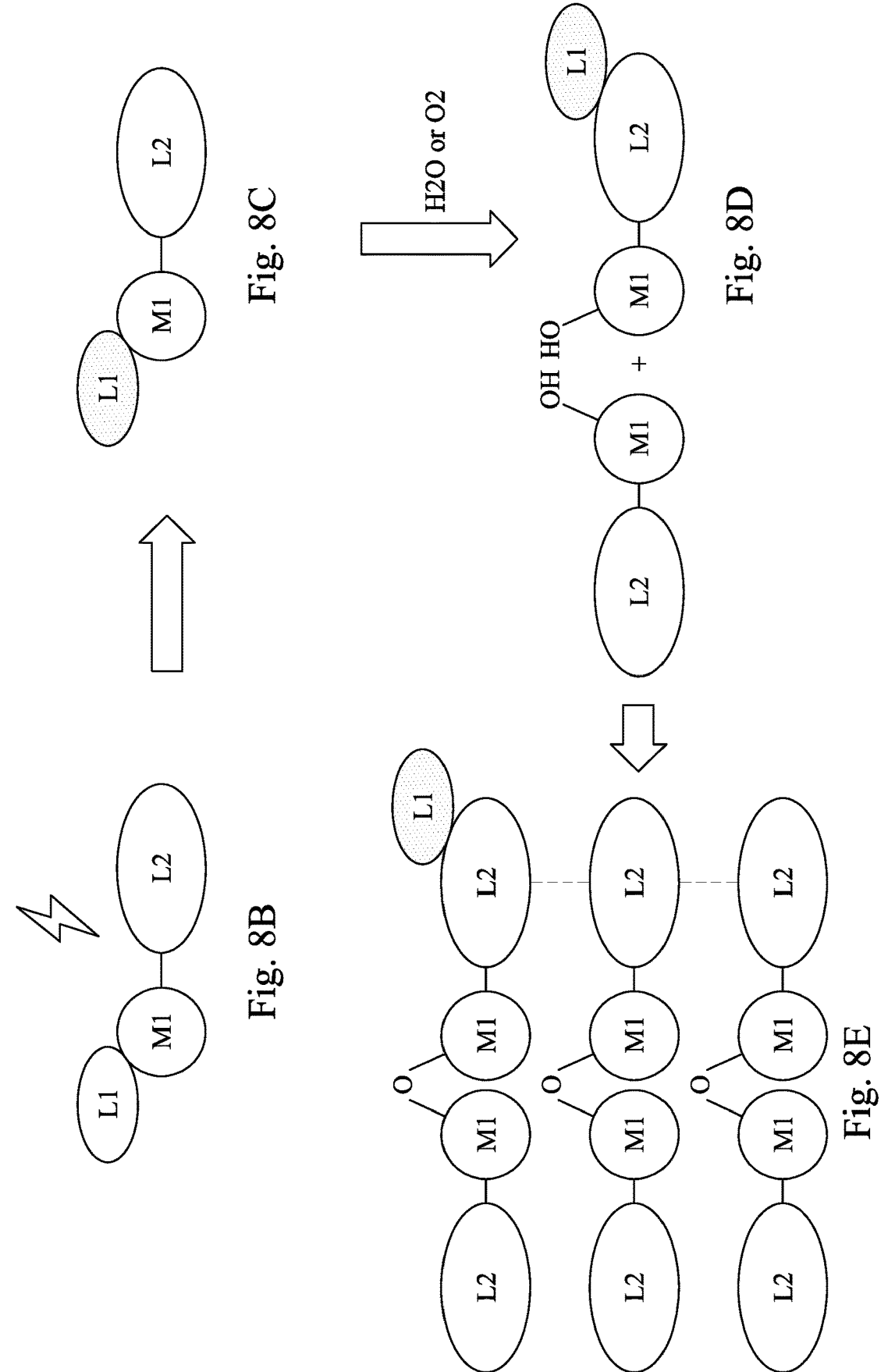
FIGS. 8B, 8C, 8D, and 8E show a reaction of a photoresist composition according to an embodiment of the disclosure undergoes when exposed to radiation.

FIGS. 8B, 8C, 8D, and 8E show a reaction of a photoresist composition according to an embodiment of the disclosure undergoes when exposed to actinic radiation. A photoresist composition, including a metal core M1 and a first photo-cleavable ligand L1 and a second ligand having a crosslinking group L2, is exposed to actinic radiation, such as extreme ultraviolet radiation, as shown in FIG. 8B. The first ligand L1 is converted to a radical upon the absorption of actinic radiation, as shown in FIG. 8C. The radical L1 is subsequently cleaved from the metal core and the radical L1 interacts with to second ligand L2 (see FIG. 8D) to activate the second ligand L2. In some embodiments, the radical L1 introduces a double bond into the second ligand L2. The metal core reacts with ambient water or oxygen to form a metal oxide or metal hydroxide, as shown in FIG. 8D. The radical activated second ligand L2 crosslinks with other second ligand groups L2 and metal hydroxide groups react in a condensation reaction to form a crosslinked metal oxide and organic framework, as shown in FIG. 8E.

Figure 9:
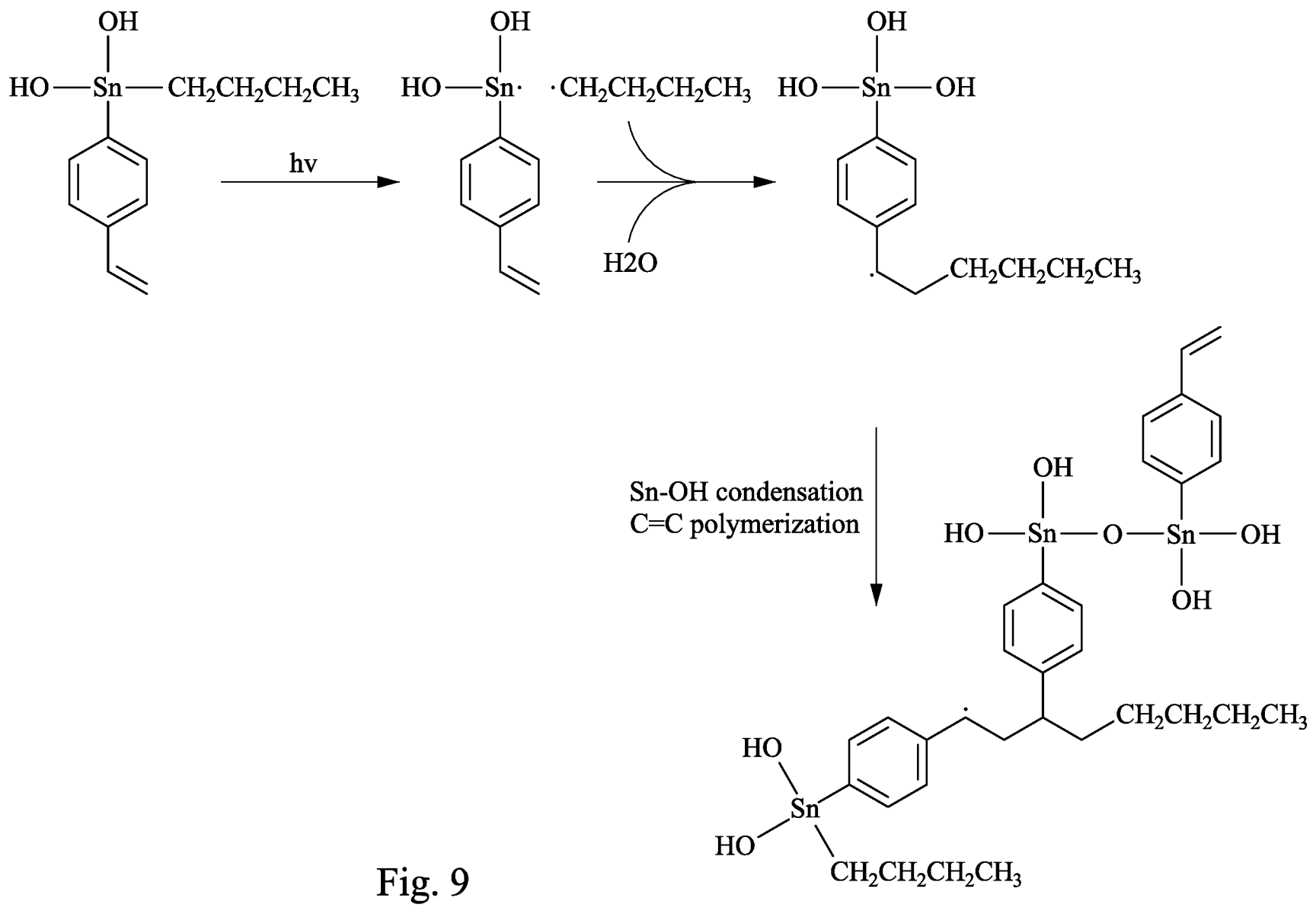

FIG. 9 shows an example of a reaction that a photoresist composition according to an embodiment of the disclosure undergoes when exposed to actinic radiation. In this example, an organometallic tin compound has a first photo-cleavable ligand, e.g.—an alkyl group, and a second ligand having a crosslinking group, e.g.—a styrene group is exposed to actinic radiation hv. The exposure to actinic radiation cleaves the alkyl group from the tin atom forming a radical. The radical organometallic tin compound reacts with ambient water and the cleaved radical alkyl group reacts with the crosslinking group on the second ligand activating (e.g.—forming a radical) the second ligand (e.g.—forming a radical). Tin hydroxide groups on one organometallic compound subsequently react with tin hydroxide groups on another organometallic compound in a condensation reaction, while the activated second ligand reacts with another second ligand on another organometallic compound in a polymerization reaction. Thus, the organometallic tin compound undergoes both an inorganic crosslinking (a condensation reaction) and an organic crosslinking via the C$=$C double bonds on the crosslinking groups in some embodiments.

In some embodiments, the depositing the photoresist on a substrate S110 of FIG. 1 includes mixing the organometallic compound with a solvent, coating a substrate with the organometallic compound/solvent mixture and then subsequently drying the photoresist layer S120, such as by heating, to remove the solvent.

In some embodiments, the operation S110 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

Figure 10:
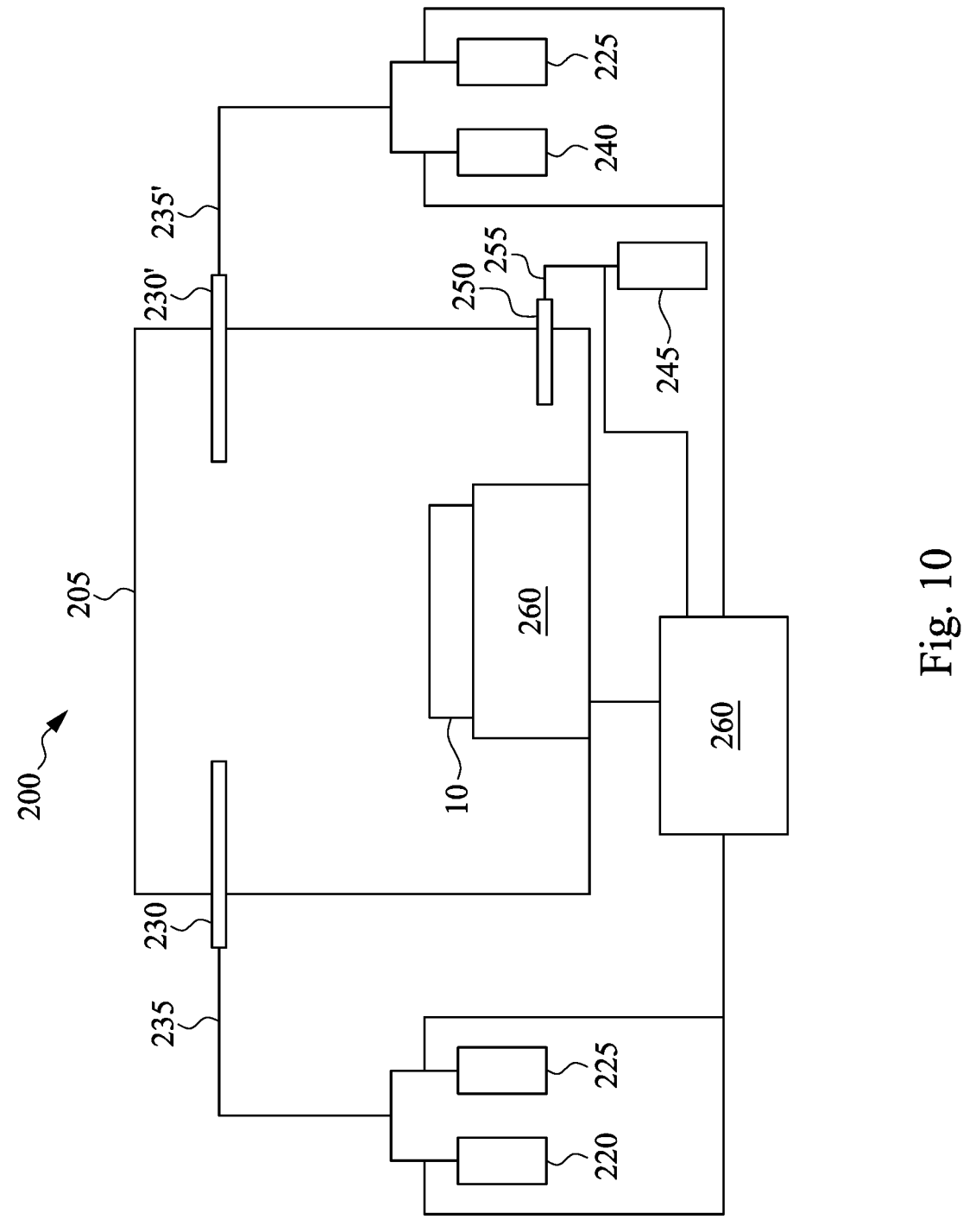
FIG. 10 shows a resist deposition apparatus according to embodiments of the disclosure.

A resist layer deposition apparatus 200 according to some embodiments of the disclosure is shown in FIG. 10. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. In some embodiments, the organometallic material is composed of one or more precursors. In some embodiments, the one or more precursors are reacted in the deposition chamber to form the organometallic material. As shown in FIG. 10, a first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

In some embodiments, depositing the photoresist layer includes combining the first compound or first precursor and the second compound or second precursor in a vapor state to form the photoresist composition. In some embodiments, only one photoresist compound or precursor is introduced into the deposition chamber. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—first one compound or precursor then a second compound or precursor, and then subsequently alternately repeating the introduction of the one compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound or precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$) or water, is pulsed to the deposition chamber in some embodiments. The $NH_3$ or water reacts with the organometallic precursor on the substrate to obtain a reaction product photoresist on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

In some embodiments, the developer 57 is applied to the photoresist layer 15 using a spin-on process. In the spin-on process, the developer 57 is applied to the photoresist layer 15 from above the photoresist layer 15 while the photoresist coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 20° C. and about 75° C. during the development operation. The development operation continues for between about 10 seconds to about 10 minutes in some embodiments.

In some embodiments, the developer includes an solvent selected from the group consisting of propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), 2-heptanone (MAK), and isobutyl propionate.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer composition 57 dissolves the photoresist regions 52 not exposed to radiation (i.e.—not crosslinked), exposing the surface of the substrate 10, as shown in FIG. 5, and leaving behind well-defined exposed photoresist regions 50, having improved definition than provided by conventional negative tone photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern of the photoresist layer 50 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 11:
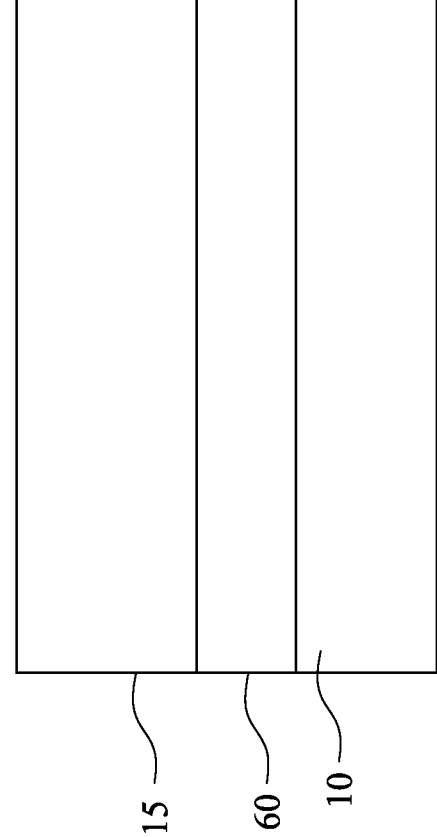
FIG. 11 shows a process stage of a sequential operation according to an embodiment of the disclosure.

In some embodiments, a target layer 60 to be patterned is disposed over the substrate prior to forming the photoresist layer, as shown in FIG. 11. In some embodiments, the target layer 60 is a metallization layer or a dielectric layer, such as a passivation layer, disposed over a metallization layer. In embodiments where the target layer 60 is a metallization layer, the target layer 60 is formed of a conductive material using metallization processes, and metal deposition techniques, including chemical vapor deposition, atomic layer deposition, and physical vapor deposition (sputtering). Likewise, if the target layer 60 a dielectric layer, the target layer 60 is formed by dielectric layer formation techniques, including thermal oxidation, chemical vapor deposition, atomic layer deposition, and physical vapor deposition.

Figure 12A:
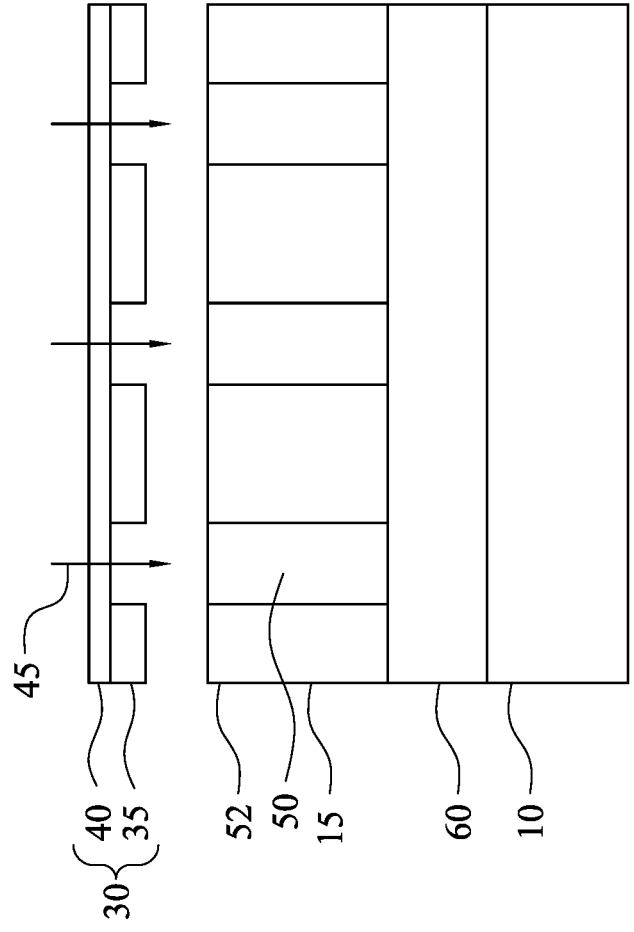
FIGS. 12A and 12B show a process stage of a sequential operation according to an embodiment of the disclosure.
Figure 12B:
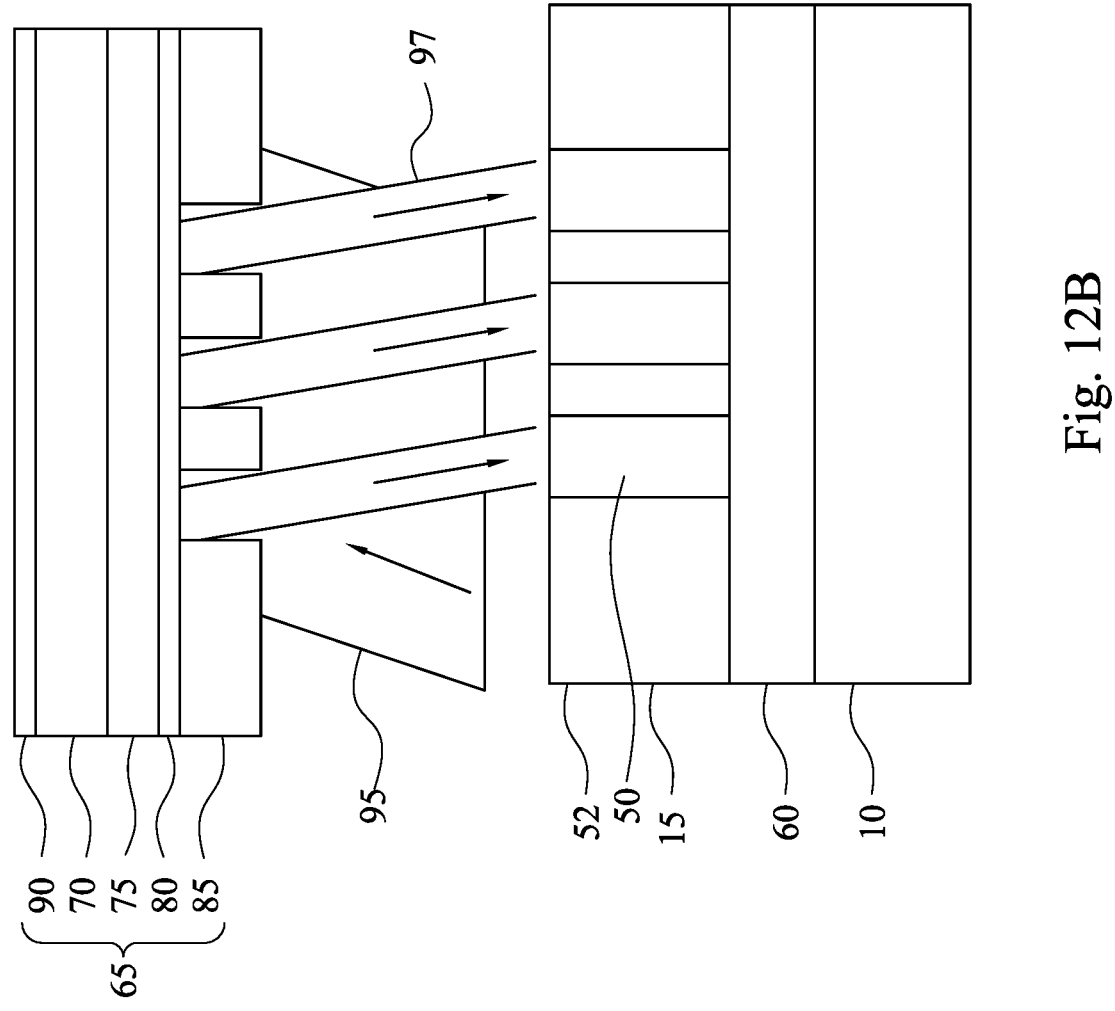

The photoresist layer 15 is subsequently selectively exposed to actinic radiation 45/97 to form exposed regions 50 and unexposed regions 52 in the photoresist layer, as shown in FIGS. 12A and 12B, and described herein in relation to FIGS. 3A and 3B. As explained herein, the photoresist is a negative photoresist, wherein polymer crosslinking occurs in the exposed regions 50 in some embodiments.

Figure 13:
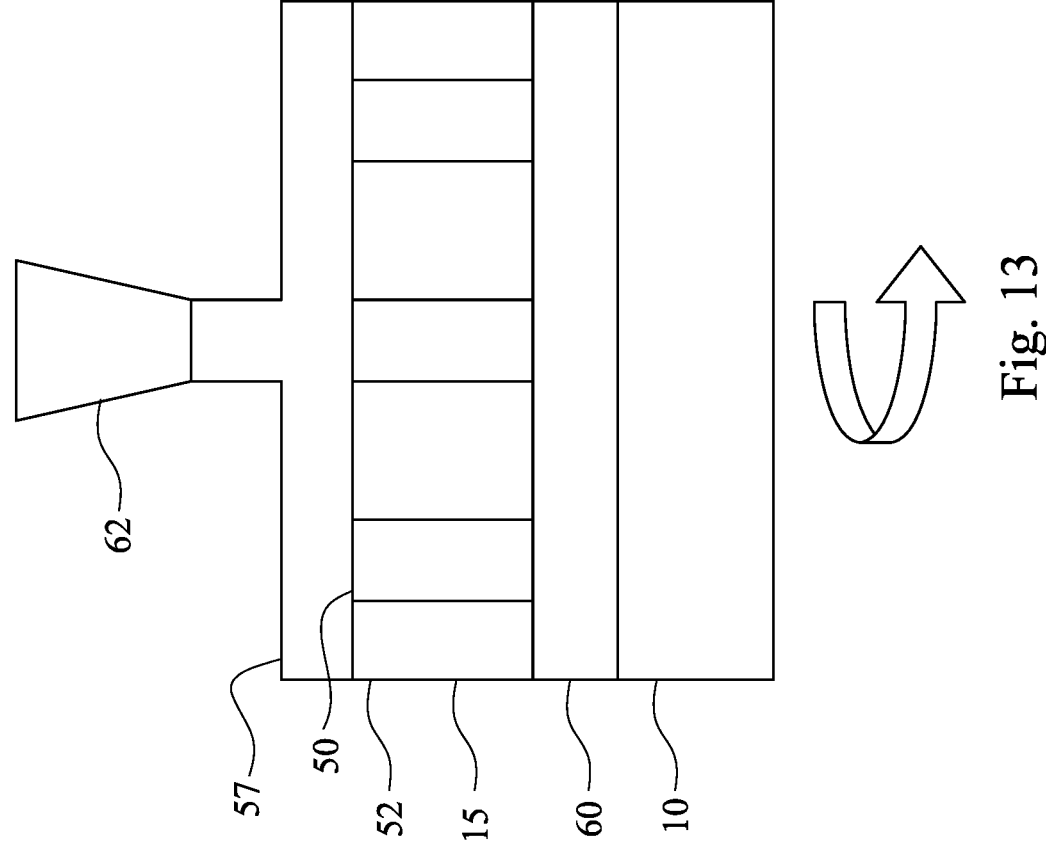
FIG. 13 shows a process stage of a sequential operation according to an embodiment of the disclosure.
Figure 14:
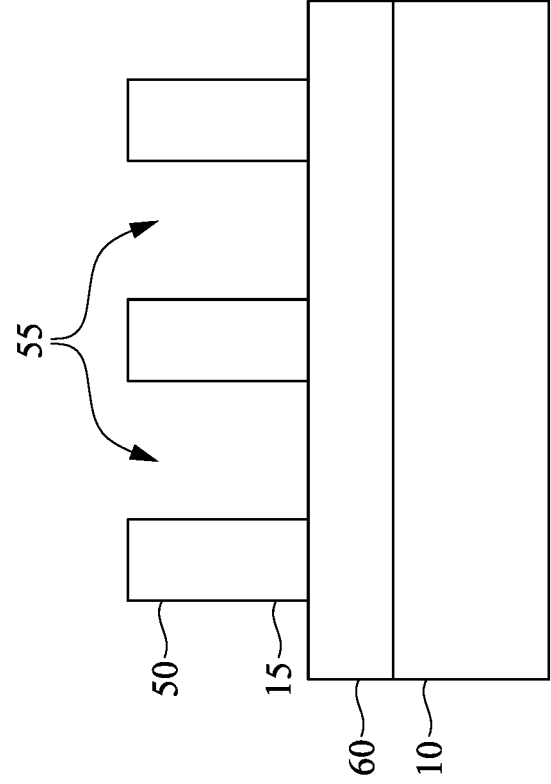
FIG. 14 shows a process stage of a sequential operation according to an embodiment of the disclosure.

As shown in FIG. 13, the unexposed photoresist regions 52 are developed by dispensing developer 57 from a dispenser 62 to form a pattern of photoresist openings 55, as shown in FIG. 14. The development operation is similar to that explained with reference to FIGS. 4 and 5, herein.

Figure 15:
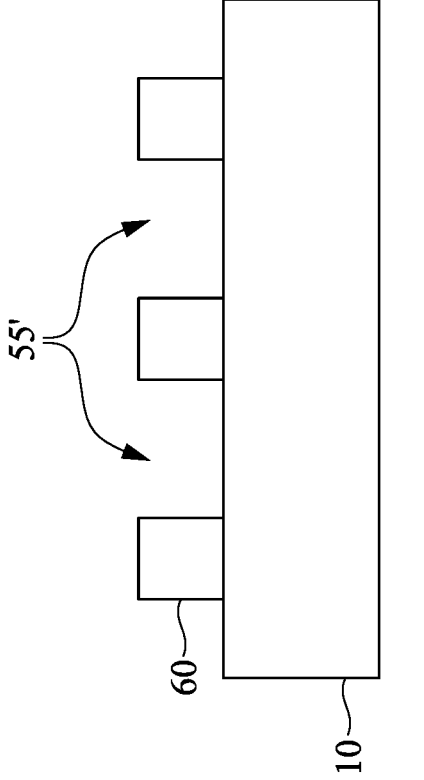
FIG. 15 shows a process stage of a sequential operation according to an embodiment of the disclosure.

Then as shown in FIG. 15, the pattern 55 in the photoresist layer 15 is transferred to the target layer 60 using an etching operation and the photoresist layer is removed, as explained with reference to FIG. 6 to form pattern 55" in the target layer 60.

Figure 16:
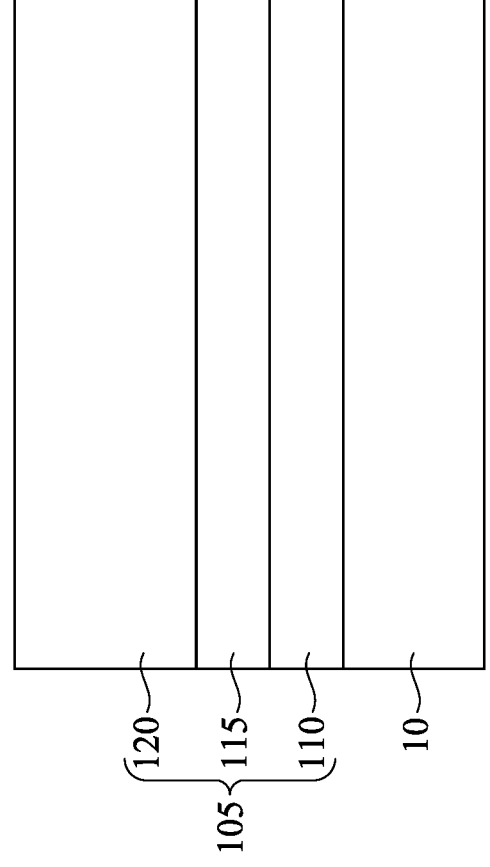
FIG. 16 shows a process stage of a sequential operation according to an embodiment of the disclosure.

FIGS. 16-19 are cross sectional views of an alternative embodiment of manufacturing a semiconductor device according to the disclosure. In some embodiments, the resist layer 105 is a tri-layer resist including a bottom layer 110 disposed over the substrate 10 or a target layer. A middle layer 115 is disposed over the bottom layer 110, and a photoresist layer 120 is disposed over the middle layer 115, as shown in FIG. 16.

In some embodiments, the bottom layer 110 is an organic material having a substantially planar upper surface, and the middle layer 115 is an anti-reflective layer. In some embodiments, the organic material of the bottom layer 110 includes a plurality of monomers or polymers that are not crosslinked. In some embodiments, the bottom layer 110 contains a material that is patternable and/or has a composition tuned to provide anti-reflection properties. Exemplary materials for the bottom layer 110 include carbon backbone polymers. The bottom layer 110 is used to planarize the structure, as the underlying structure may be uneven depending on the structure of devices in an underlying device layer. In some embodiments, the bottom layer 110 is formed by a spin coating process. In certain embodiments, the thickness of the bottom layer 110 ranges from about 30 nm to about 500 nm.

The middle layer 115 of the tri-layer resist structure may have a composition that provides anti-reflective properties for the photolithography operation and/or hard mask properties. In some embodiments, the middle layer 115 includes a silicon-containing layer (e.g., a silicon hard mask material). The middle layer 115 may include a silicon-containing inorganic polymer. In other embodiments, the middle layer 115 includes a siloxane polymer. In other embodiments, the middle layer 115 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The middle layer 115 may be bonded to adjacent layers, such as by covalent bonding, hydrogen bonding, or hydrophilic-to-hydrophilic forces.

Figure 17:
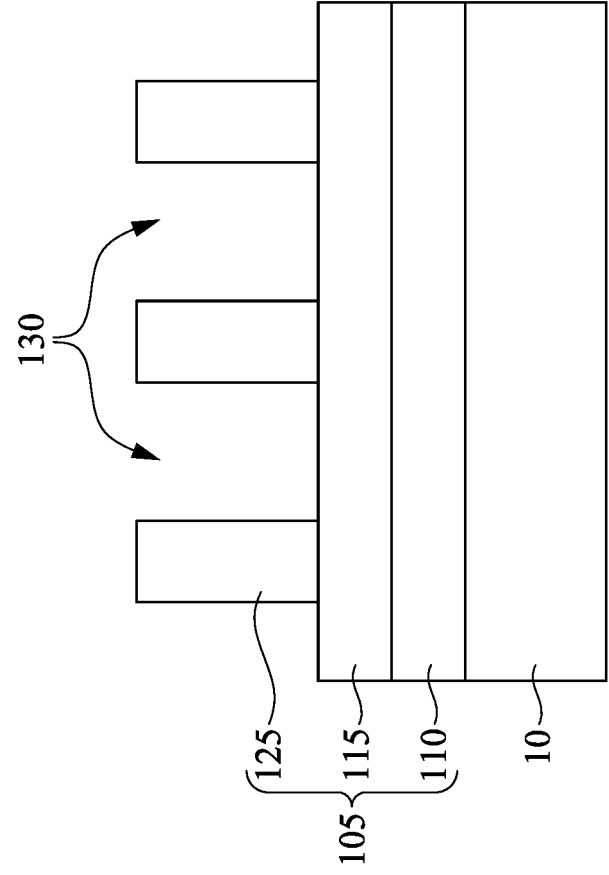
FIG. 17 shows a process stage of a sequential operation according to an embodiment of the disclosure.

The photoresist layer 120 may be composed of any the photoresist compositions disclosed herein with respect to the photoresist layer 15 in FIG. 2. The photoresist layer 120 is photolithographically patterned to provide a pattern including exposed regions 125 of the photoresist layer and openings 130, as shown in FIG. 17. The photoresist layer is patternwise exposed to actinic radiation and developed according to the patterning operations disclosed herein with reference to FIGS. 3A, 3B, and 4 in some embodiments.

Figure 18:
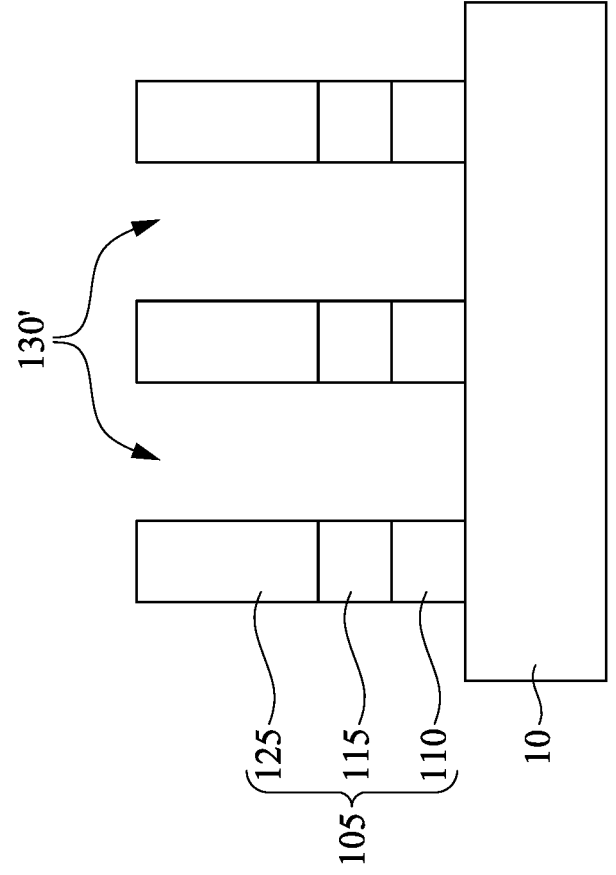
FIG. 18 shows a process stage of a sequential operation according to an embodiment of the disclosure.

The pattern 130' is extended into the middle layer 115 and bottom layer 110, as shown in FIG. 18, in some embodiments. The middle layer 115 and bottom layer 110 are etched using the photoresist layer 125 as an etch mask. The middle layer 115 and bottom layer 110 may be etched by wet or dry etching depending on the materials to be etched and the desired configuration of the pattern 130'.

Figure 19:
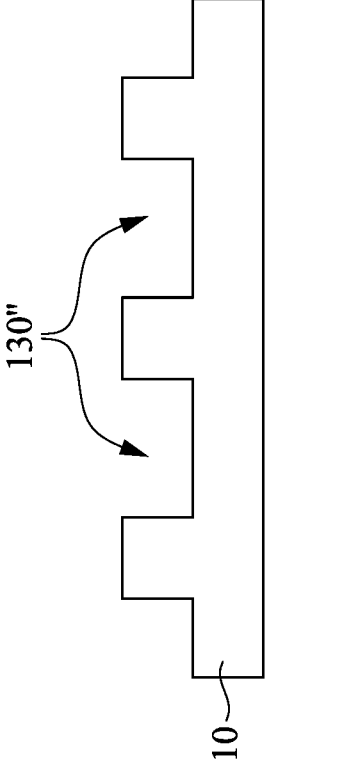
FIG. 19 shows a process stage of a sequential operation according to an embodiment of the disclosure.

The pattern in the tri-layer resist 105 is then extended into the substrate 10 or a target layer and the remaining photoresist layer 120, middle layer 115, and bottom layer are removed, as shown in FIG. 19. The pattern 130" is extended into the substrate 10 or a target layer using a suitable etching operation. The etchant used in the etching operation is selective to the substrate or target layer in some embodiments. The photoresist layer 120 may be removed by a suitable photoresist stripping or photoresist ashing operation in some embodiments. In some embodiments, the middle layer 115, and bottom layer 110 are removed during the photoresist stripping, photoresist ashing, or substrate etching operation. In some embodiments, different etching operations using different etchants are performed to remove each of the middle layer 115 and the bottom layer 110, and to etch the substrate 10 or target layer.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel photoradical-assisted self-polymerization photoresist compositions and photolithography techniques according to the present disclosure reduce the amount of film loss during development and reduce photoresist shrinkage. Embodiments of the present disclosure provide improved photoresist pattern contrast and allow reduced exposure dose and increase the manufacturing yield of semiconductor devices.

An embodiment of the disclosure is a method of manufacturing a semiconductor device, including forming a photoresist layer over a substrate. The photoresist layer includes a photoresist composition including a polymer. The polymer includes a monomer unit having a pendant sensitizer and crosslinking group, and a monomer unit having a pendant acid labile group. The photoresist layer is selectively exposed to actinic radiation, and the selectively exposed photoresist layer is developed. In an embodiment, the photoresist composition includes a photoacid generator. In an embodiment, the photoacid generator releases an acid and the sensitizer generates secondary electrons upon exposure to radiation. In an embodiment, the polymer includes a monomer unit having a pendant organic group, wherein the pendant organic group is an unsubstituted C1-C30 group or a C1-C30 group substituted with one or more of —I, —Br, —Cl, —F, —NH$_2$, —COOH, —OH, —SH, —N$_3$, —S(=O)—, an alkene group, an alkyne group, an imine group, an ether group, an ester group, an aldehyde group, a ketone group, an amide group, a sulfone group, an acetic acid group, a carboxylic acid group, or a cyanide group. In an embodiment, the polymer has a weight average molecular weight of 1000 to 200,000. In an embodiment, portions of the photoresist layer not exposed to actinic radiation are removed during the developing the selectively exposed photoresist layer. In an embodiment, the polymer undergoes an acid labile group deprotection reaction and a crosslinking reaction upon exposure radiation. In an embodiment, the photoresist layer is a top layer of a tri-layer resist. In an embodiment, after the selectively exposing, the polymer becomes hydrophilic. In an embodiment, the method includes brining an organic bottom layer over the substrate, and forming a middle layer over the organic bottom layer, wherein the photoresist layer is formed over the middle layer. In an embodiment, the middle layer is an inorganic layer.

Another embodiment of the disclosure is a method of manufacturing a semiconductor device, including forming a photoresist layer over a substrate, wherein the photoresist layer includes a photoresist composition including an organometallic material. The organometallic material includes a metal and a crosslinking group. The photoresist layer is selectively exposed to actinic radiation. The selective exposing causes the organometallic material to polymerize. The selectively exposed photoresist layer is developed. In an embodiment, the organometallic material includes one or more ligands. In an embodiment, the one or more ligands include a first ligand and a second ligand, the first ligand dissociates upon exposure to the actinic radiation, and the dissociated first ligand reacts with the second ligand. In an embodiment, the crosslinking group is on the second ligand. In an embodiment, the actinic radiation is extreme ultraviolet radiation. In an embodiment, the method includes heating the selectively exposed photoresist layer before the developing. In an embodiment, the method includes removing a portion of the substrate exposed by the developing.

Another embodiment of the disclosure is a method of manufacturing a semiconductor device, including forming a photoresist layer over a substrate. The photoresist layer includes a photoresist composition comprising a monomer, wherein the monomer includes a metal and a crosslinking group. The photoresist layer is selectively exposed to actinic radiation. The selectively exposing causes the monomers to bond to each other through the crosslinking group and the metals, and the selectively exposed photoresist layer is developed. In an embodiment, the monomer is an organometallic compound. In an embodiment, the monomer includes one or more ligands. In an embodiment, the ligands dissociate upon exposure to the actinic radiation, and dissociated ligands react with other ligands. In an embodiment, the actinic radiation is extreme ultraviolet radiation. In an embodiment, the method includes heating the selectively exposed photoresist layer before the developing. In an embodiment, the method includes removing a portion of the substrate exposed by the developing. In an embodiment, the ligands dissociate upon the exposure to the actinic radiation, complexation or condensation occurs, and the dissociated ligands polymerize with non-cleavable crosslinkable ligands.

Another embodiment of the disclosure is a photoresist composition, including a polymer, wherein the polymer includes a monomer unit having a pendant sensitizer and crosslinking group, and a monomer unit having a pendant acid labile group. The composition includes a photoactive compound. In an embodiment, the photoactive compound is a photoacid generator. In an embodiment, the polymer includes a monomer unit having a pendant organic group, wherein the pendant organic group is an unsubstituted C1-C30 group or a C1-C30 group substituted with one or more of —I, —Br, —Cl, —F, —NH$_2$, —COOH, —OH, —SH, —N$_3$, —S(═O)—, an alkene group, an alkyne group, an imine group, an ether group, an ester group, an aldehyde group, a ketone group, an amide group, a sulfone group, an acetic acid group, a carboxylic acid group, or a cyanide group. In an embodiment, the crosslinking group is bonded to the sensitizer, and the crosslinking group is one or more of a C2-C30 aliphatic or aromatic group having a functional group selected from the group consisting of an epoxy group, an azo group, an alkyl halide group, an imine group, an alkene group, an alkyne group, a peroxide group, a ketone group, an aldehyde group, an allene group, or a heterocyclic group. In an embodiment, the sensitizer is one or more of a C3-C20 aliphatic or aromatic group having one or more photosensitive functional groups. In an embodiment, the one or more photosensitive groups are selected from the group consisting of a substituted or unsubstituted aromatic group and a substituted or unsubstituted heterocyclic group. In an embodiment, the aromatic group is one or more selected from the group consisting of a phenyl group, a naphthalenyl group, a phenanthrenyl group, an anthracenyl group, a phenalenyl group, and a three- to five-membered ring. In an embodiment, the aromatic group or heterocyclic group is substituted with one or more selected from the group consisting of a C1-C4 alkyl group, —F, —Cl, —Br, —I, —OH, —COOH, —COOR, —NO$_2$, —NH$_2$, —NHR, —NR$_2$, —CN, —SH, a carbonyl group, and a thionyl group, where R is a C1-C4 alkyl group. In an embodiment, the aromatic group is one or more selected from the group consisting of a phenyl group, a naphthalenyl group, a phenanthrenyl group, an anthracenyl group, a phenalenyl group, and a three- to ten-membered ring. In an embodiment. the acid labile group is a cyclic or non-cyclic, substituted or unsubstituted aliphatic or aromatic group, or a heterocyclic group. In an embodiment, the acid labile group is one or more selected from the group consisting of an ester group, an amide group, an imine group, an acetal group, a ketal group, an anhydride group, a sulfonic ester group, a t-butyl group, a tert-butoxycarbonyl group, an iso-norbornyl group, a 2-methyl-2-adamantyl group, a 2-ethyl-2-adamantyl group, a 3-tetrahydrofuran group, a lactone group, a 2-tetrahydrofuran group, 2-tetrahydropyran group, wherein the acid labile group is unsubstituted or substituted with one or more functional groups selected from the group consisting of —I, —Br, —Cl, —F, —NH$_2$, —COOH, —OH, —SH, —N$_3$, —S(═O)—, an alkene group, an alkyne group, an imine group, an ether group, a vinyl ether group, an acetal group, a hemiacetal group, an ester group, an aldehyde group, a ketone group, an amide group, a sulfone group, an acetic acid group, a cyanide group, and an allene group. In an embodiment, the polymer has a weight average molecular weight of 1000 to 200,000. In an embodiment, the photoresist composition includes a solvent. In an embodiment, the photoresist composition includes a quencher. In an embodiment, the photoresist composition includes a surfactant.

Another embodiment of the disclosure is a photoresist composition, including an organometallic monomer including: a metal core, a first photo-cleavable ligand, and a second non-photo-cleavable ligand having a crosslinking group. In an embodiment, the metal core includes one or more metal atoms. In an embodiment, the one or more metal atoms are selected from the group consisting of Hf, Zr, Ti, Cr, W, Mo, Fe, Ru, Os, Co, Rh, Ir, Ni, Pd, Pt, Cu, Ag, Au, Zn, Cd, Al, Ga, Tl, Ge, Sn, Pb, Sb, and Bi. In an embodiment, the first ligand is an aliphatic or aromatic, cyclic or non-cyclic C1-C30 group, wherein the C1-C30 group is unsubstituted or substituted with one or more selected from the group consisting of —I, —Br, —Cl, —F, —NH$_2$, —COOH, —OH, —SH, —N$_3$, —S(═O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In an embodiment, the photoresist composition includes a third ligand, wherein the third ligand is different from the first photosensitive ligand and the second non-photosensitive ligand. In an embodiment, the second non-photo-cleavable ligand is an aliphatic or aromatic, cyclic or non-cyclic C2-C30 group, wherein the C2-C30 group is unsubstituted or substituted with one or more selected from the group consisting of —I, —Br, —Cl, —F, —NH$_2$, —COOH, —OH, —SH, —N$_3$, —S(=O)—, an alkene group, an alkyne group, an imine group, an ether group, an ester group, an aldehyde group, a ketone group, an amide group, a sulfone group, an acetic acid group, a cyanide group, an allene group, an alcohol group, a diol group, an amine group, a phosphine group, a phosphite group, an aniline group, a pyridine group, and a pyrrole group. In an embodiment, the photoresist composition includes a solvent. In an embodiment, the photoresist composition includes a quencher. In an embodiment, the photoresist composition includes a surfactant. In an embodiment, the photoresist composition includes a chromophore. In an embodiment, the photoresist composition includes counter ions.

Another embodiment of the disclosure is a method of manufacturing a semiconductor device, including forming a resist layer over a substrate. The resist layer is made of a resist composition, and the resist composition includes an organometallic monomer having a metal core, a first ligand, and a second ligand having a crosslinking group. The first ligand is converted to a radical in a first portion of the resist layer. The radical is cleaved from the metal core and the metal core is reacted with water or oxygen to form a metal oxide or metal hydroxide in the first portion of the resist layer. The crosslinking group on the second ligand is activated by the radical to crosslink with other second ligands in the first portion of the resist layer. A second portion of the resist layer is removed where the first ligand was not converted to a radical. In an embodiment, the method includes removing portions of the substrate below the second portions of the resist layer. In an embodiment, the converting the first ligand to a radical includes exposing first portion of the resist layer to actinic radiation. In an embodiment, the actinic radiation is extreme ultraviolet radiation. In an embodiment, the method includes forming an organic bottom layer over the substrate, and forming a middle layer over the organic bottom layer, wherein the resist layer is formed over the middle layer. In an embodiment, the middle layer is an inorganic layer. In an embodiment, the method includes heating the resist layer after the converting the first ligand to a radical in a first portion of the resist layer and before the removing a second portion of the resist layer where the first ligand was not converted to a radical.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist composition, comprising:
a polymer,
wherein the polymer comprises:
   a monomer unit having a pendant sensitizer and cross-linking group, and
   a monomer unit having a pendant acid labile group; and
a photoactive compound, wherein the crosslinking group is bonded to the sensitizer, and the crosslinking group is one or more of a C2-C30 aromatic group having a functional group selected from the group consisting of an azo group, an alkyl halide group, and a peroxide group.

2. The photoresist composition of claim 1, wherein the photoactive compound is a photoacid generator.

3. The photoresist composition of claim 1, wherein the polymer further comprises a monomer unit having a pendant organic group, wherein the pendant organic group is an unsubstituted C1-C30 group or a C1-C30 group substituted with one or more of —I, —Br, —Cl, —F, —NH$_2$, —COOH, —OH, —SH, —N$_3$, —S(=O)—, an alkene group, an alkyne group, an imine group, an ether group, an ester group, an aldehyde group, a ketone group, an amide group, a sulfone group, an acetic acid group, a carboxylic acid group, or a cyanide group.

4. The photoresist composition of claim 1, wherein the crosslinking group includes a functional group selected from the group consisting of an alkyl halide group and a peroxide group.

5. The photoresist composition of claim 1, wherein the sensitizer is one or more of a C3-C20 aliphatic or aromatic group having one or more photosensitive functional groups.

6. The photoresist composition of claim 1, wherein the acid labile group is a cyclic or non-cyclic, substituted or unsubstituted aliphatic or aromatic group, or a heterocyclic group.

7. The photoresist composition of claim 1, wherein the acid labile group is one or more selected from the group consisting of an ester group, an amide group, an imine group, an acetal group, a ketal group, an anhydride group, a sulfonic ester group, a t-butyl group, a tert-butoxycarbonyl group, an iso-norbornyl group, a 2-methyl-2-adamantyl group, a 2-ethyl-2-adamantyl group, a 3-tetrahydrofuran group, a lactone group, a 2-tetrahydrofuran group, 2-tetrahydropyran group, wherein the acid labile group is unsubstituted or substituted with one or more functional groups selected from the group consisting of —I, —Br, —Cl, —F, —NH$_2$, —COOH, —OH, —SH, —N$_3$, —S(=O)—, an alkene group, an alkyne group, an imine group, an ether group, a vinyl ether group, an acetal group, a hemiacetal group, an ester group, an aldehyde group, a ketone group, an amide group, a sulfone group, an acetic acid group, a carboxyl group, a cyanide group, and an allene group.

8. A photoresist composition, comprising:
a polymer,
wherein the polymer comprises:
   a monomer unit having a pendant sensitizer selected from the group consisting of a substituted aromatic group and an unsubstituted aromatic group,
   a crosslinking group bonded to the sensitizer, wherein the crosslinking group is selected from the group consisting of one or more of a C2-C30 aromatic group having a functional group selected from the group consisting of an azo group, an alkyl halide group, and a peroxide group;
   a monomer unit having a pendant organic group, wherein the pendant organic group is an unsubstituted C1-C30 group or a C1-C30 group substituted with one or more of —I, —Br, —Cl, —F, —NH$_2$, —COOH, —OH, —SH, —N$_3$, —S(=O)—, an alkene group, an alkyne group, an imine group, an ether group, an ester group, an aldehyde group, a ketone group, an amide group, a sulfone group, an acetic acid group, a carboxylic acid group, or a cyanide group; and a monomer unit having a pendant acid labile group; and a photoacid generator.

9. The photoresist composition of claim 8, wherein the pendant sensitizer is selected from the group consisting of a phenyl group, a naphthalenyl group, a phenanthrenyl group, an anthracenyl group, and a phenalenyl group.

10. The photoresist composition of claim 9, wherein the substituted aromatic group of the sensitizer is substituted with one or more selected from the group consisting of a C1-C4 alkyl group, —F, —Cl, —Br, —I, —OH, —COOH, —COOR, —NO₂, —NH₂, —NHR, —NR₂, —CN, —SH, a carbonyl group, and a thionyl group, where R is a C1-C4 alkyl group.

11. The photoresist composition of claim 8, wherein the acid labile group is one or more selected from the group consisting of an ester group, an amide group, an imine group, an acetal group, a ketal group, an anhydride group, a sulfonic ester group, a t-butyl group, a tert-butoxycarbonyl group, an iso-norbornyl group, a 2-methyl-2-adamantyl group, a 2-ethyl-2-adamantyl group, a 3-tetrahydrofuran group, a lactone group, a 2-tetrahydrofuran group, 2-tetra-hydropyran group, wherein the acid labile group is unsubstituted or substituted with one or more functional groups selected from the group consisting of —I, —Br, —Cl, —F, —NH₂, —COOH, —OH, —SH, —N₃, —S(═O)—, an alkene group, an alkyne group, an imine group, an ether group, a vinyl ether group, an acetal group, a hemiacetal group, an ester group, an aldehyde group, a ketone group, an amide group, a sulfone group, an acetic acid group, a carboxyl group, a cyanide group, and an allene group.

12. The photoresist composition of claim 8, wherein the polymer has a weight average molecular weight of 1000 to 200,000.

13. The photoresist composition of claim 8, further comprising a quencher.

14. A photoresist composition, comprising:
a polymer, comprising:
a monomer unit having a pendant sensitizer group and a crosslinking group bonded to the sensitizer, and
a monomer unit having a pendant acid labile group,
wherein the sensitizer group is selected from the group consisting of a phenyl group, a naphthalenyl group, a phenanthrenyl group, an anthracenyl group, and a phenalenyl group, and the crosslinking group is one or more of a C2-C30 aromatic group having a functional group selected from the group consisting of an azo group, an alkyl halide group, and a peroxide group; and
a photoactive compound.

15. The photoresist composition of claim 14, wherein the photoactive compound is a photoacid generator.

16. The photoresist composition of claim 14, wherein the acid labile group is a cyclic or non-cyclic, substituted or unsubstituted aliphatic or aromatic group, or a heterocyclic group.

17. The photoresist composition of claim 14, wherein the sensitizer is substituted with one or more selected from the group consisting of a C1-C4 alkyl group, —F, —Cl, —Br, —I, —OH, —COOH, —COOR, —NO₂, —NH₂, —NHR, —NR₂, —CN, —SH, a carbonyl group, and a thionyl group, where R is a C1-C4 alkyl group.

18. The photoresist composition of claim 14, wherein the acid labile group is one or more selected from the group consisting of an ester group, an amide group, an imine group, an acetal group, a ketal group, an anhydride group, a sulfonic ester group, a t-butyl group, a tert-butoxycarbonyl group, an iso-norbornyl group, a 2-methyl-2-adamantyl group, a 2-ethyl-2-adamantyl group, a 3-tetrahydrofuran group, a lactone group, a 2-tetrahydrofuran group, 2-tetra-hydropyran group, wherein the acid labile group is unsubstituted or substituted with one or more functional groups selected from the group consisting of —I, —Br, —Cl, —F, —NH₂, —COOH, —OH, —SH, —N₃, —S(═O)—, an alkene group, an alkyne group, an imine group, an ether group, a vinyl ether group, an acetal group, a hemiacetal group, an ester group, an aldehyde group, a ketone group, an amide group, a sulfone group, an acetic acid group, a carboxyl group, a cyanide group, and an allene group.

19. The photoresist composition of claim 14, wherein the polymer has a weight average molecular weight of 1000 to 200,000.

20. The photoresist composition of claim 14, further comprising a quencher.

* * * * *